(12) United States Patent
Noguchi

(10) Patent No.: US 11,483,929 B2
(45) Date of Patent: Oct. 25, 2022

(54) OPTICAL MODULE

(71) Applicant: CIG Photonics Japan Limited, Kanagawa (JP)

(72) Inventor: Daisuke Noguchi, Tachikawa (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 17/375,389

(22) Filed: Jul. 14, 2021

(65) Prior Publication Data

US 2022/0061159 A1     Feb. 24, 2022

(30) Foreign Application Priority Data

Aug. 21, 2020  (JP) .............. JP2020-140168

(51) Int. Cl.
    *H05K 1/11*     (2006.01)
    *H05K 1/02*     (2006.01)

(52) U.S. Cl.
    CPC ............. *H05K 1/118* (2013.01); *H05K 1/028* (2013.01); *H05K 1/0296* (2013.01); *H05K 1/117* (2013.01)

(58) Field of Classification Search
    CPC .......... H05K 1/11; H05K 1/118; H05K 1/028; H05K 1/117; H05K 1/0296
    USPC ....................................................... 174/254
    See application file for complete search history.

(56) References Cited

U.S. PATENT DOCUMENTS 10,299,389 B2     5/2019    Shi

FOREIGN PATENT DOCUMENTS

JP      2016-127205 A     7/2016

*Primary Examiner* — Tremesha S Willis
(74) *Attorney, Agent, or Firm* — Mattingly & Malur, PC

(57) ABSTRACT

An optical module includes: an optical sub-assembly; and a flexible substrate including an insulating film, an interconnection pattern, and a spacer layer, the flexible substrate being connected to the optical sub-assembly. The insulating film has some projections, the projections protruding from a basic area in a first direction, the projections being arranged in a second direction perpendicular to the first direction, the insulating film having a flat shape with a recess between an adjacent pair of the projections. The interconnection pattern includes some pads in the basic area on a first surface of the insulating film, the pads being arranged in the second direction. The pads include some first pads adjacent to the respective projections, the pads including at least one second pad adjacent to the recess. The spacer layer is on the first surface and at each of the protrusions.

16 Claims, 12 Drawing Sheets

OPTICAL MODULE

CROSS-REFERENCE TO RELATED APPLICATION

The present application claims priority from Japanese patent application JP2020-140168 filed on Aug. 21, 2020, the contents of which are hereby incorporated by reference into this application.

BACKGROUND

1. Field

The disclosure relates to an optical module.

2. Description of the Related Art

To connect an FPC (Flexible Printed Circuit) and a PCB (Printed Circuit board), of an optical module, solder is often used. For example, a method is known where solder is applied to a terminal of the PCB and soldering is done by instantaneous heating using a hot bar (JP2016-127205A).

During the heating by the hot bar, the FPC and PCB are pressed with a jig, whereby the solder flows outward, resulting in difficulty of ensuring a sufficient amount of the solder. This necessitates adding the solder by hand to ensure mechanical strength and reliability.

SUMMARY

The disclosure aims at ensuring a sufficient amount of a filler metal.

(1) An optical module includes: an optical sub-assembly; and a flexible substrate including an insulating film, an interconnection pattern, and a spacer layer, the flexible substrate being connected to the optical sub-assembly. The insulating film has some projections, the projections protruding from a basic area in a first direction, the projections being arranged in a second direction perpendicular to the first direction, the insulating film having a flat shape with a recess between an adjacent pair of the projections. The interconnection pattern includes some pads in the basic area on a first surface of the insulating film, the pads being arranged in the second direction. The pads include some first pads adjacent to the respective projections, the pads including at least one second pad adjacent to the recess. The spacer layer is on the first surface and at each of the protrusions.

The spacer layer can secure a space for bonding on the pads. This is beneficial for securing a sufficient amount of a filler metal.

(2) In the optical module according to (1), the at least one second pad may be one of the pads.

(3) In the optical module according to (1), the at least one second pad may be two of the pads.

(4) In the optical module according to any one of (1) to (3), the projections may be three or more projections.

(5) In the optical module according to any one of (1) to (4), the flexible substrate may include a cover layer on the first surface and in the basic area, the cover layer covering the interconnection pattern except for the pads, and the spacer layer may be equal in material and thickness to the cover layer.

(6) In the optical module according to (5), the interconnection pattern may include a ground plane on the first surface, and the ground plane may be between the insulating film and the cover layer.

(7) In the optical module according to (6), the ground plane may be continuous from the first pads.

(8) In the optical module according to any one of (1) to (7), the interconnection pattern may include some dummy terminals, the dummy terminals being between the insulating film and the spacer layer, the dummy terminals being at the projections, the dummy terminals being continuous from the first pads.

(9) In the optical module according to any one of (1) to (8), the interconnection pattern may include at least one signal line on a second surface opposite to the first surface, and the at least one signal line may penetrate the insulating film and may be connected to the at least one second pad.

(10) The optical module according to any one of (1) to (9) may include: a printed circuit board including a conductor pattern, the conductor pattern including some electrodes opposed to the respective pads, the printed circuit board being opposed to the projections and in contact with the spacer layer; and a filler metal between the pads and the electrodes.

(11) In the optical module according to (10), the conductor pattern may include a conductive plane continuous from at least one of the electrodes.

(12) In the optical module according to (11), the conductor pattern may include at least one transmission line continuous from another at least one of the electrodes, and the conductive plane may be on both sides of the at least one transmission line.

(13) In the optical module according to (12), the electrodes may include some first electrodes opposed to the respective first pads and at least one second electrode opposed to the at least one second pad.

(14) In the optical module according to any one of (11) to (13), the spacer layer may be in contact with the conductive plane.

(15) In the optical module according to any one of (10) to (13), the printed circuit board further may include a protective layer covering the conductor pattern except for the electrodes, and the spacer layer may be in contact with the protective layer.

(16) In the optical module according to any one of (1) to (15), the optical sub-assembly may be brazed or soldered to the interconnection pattern except at the pads.

DETAILED DESCRIPTION

Figure 1:
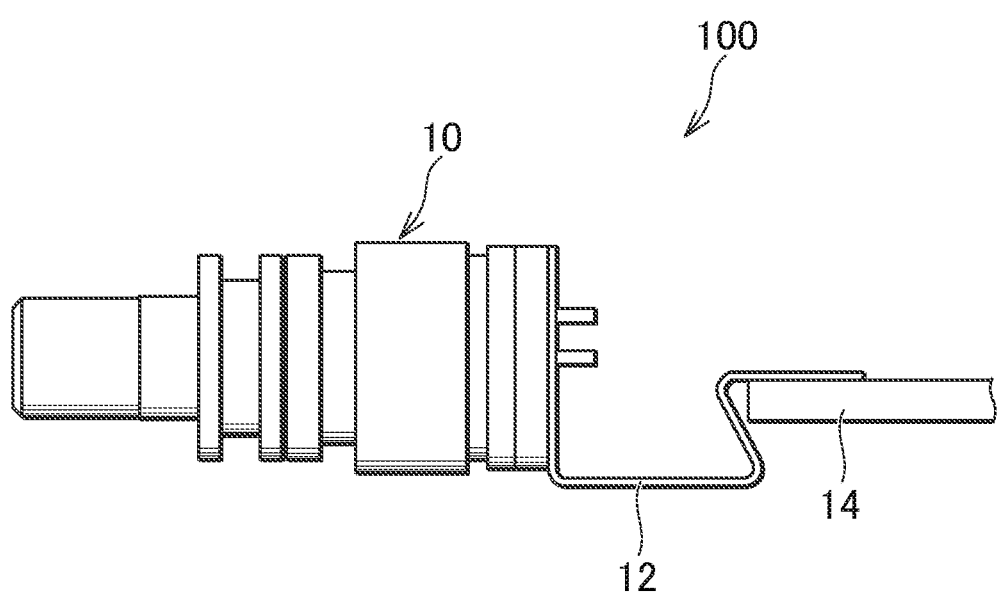
FIG. 1 is a side view of an optical module in a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

FIG. 1 is a side view of an optical module in a first embodiment. The optical module 100 has an optical sub-assembly 10. The optical sub-assembly 10 is a transistor outline can (TO-CAN) type package and may be any of a transmitter optical sub-assembly (TOSA) including a light emitting device, a receiver optical sub-assembly (ROSA) including a light receiving device, and a bidirectional optical sub-assembly (BOSA) including both a light emitting device and a light receiving device. The optical sub-assembly 10 is connected to a flexible substrate 12. The flexible substrate 12 is connected to a printed circuit board 14.

Figure 2:
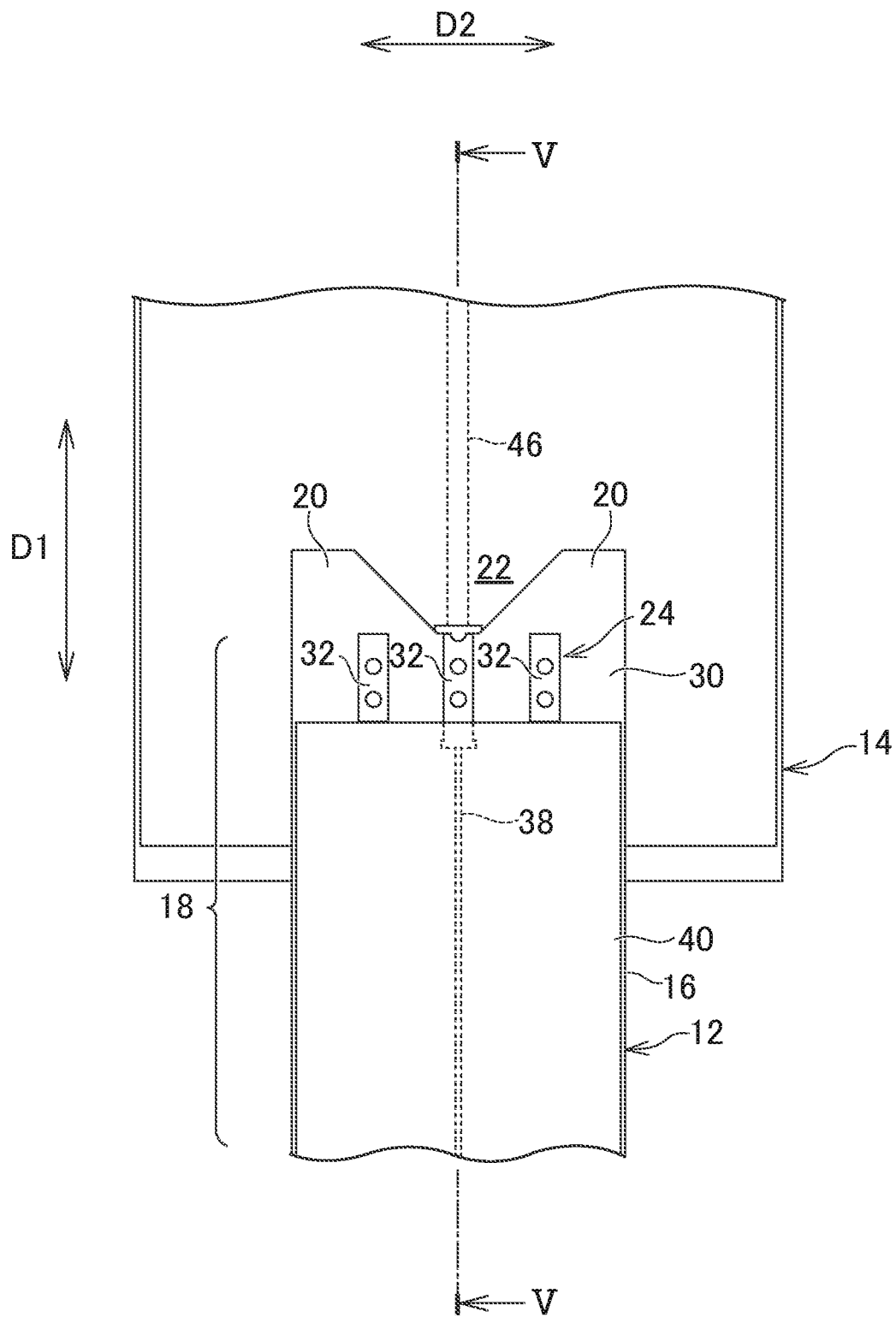
FIG. 2 is a plan view of a flexible substrate and a printed circuit board, connected.
Figure 3:
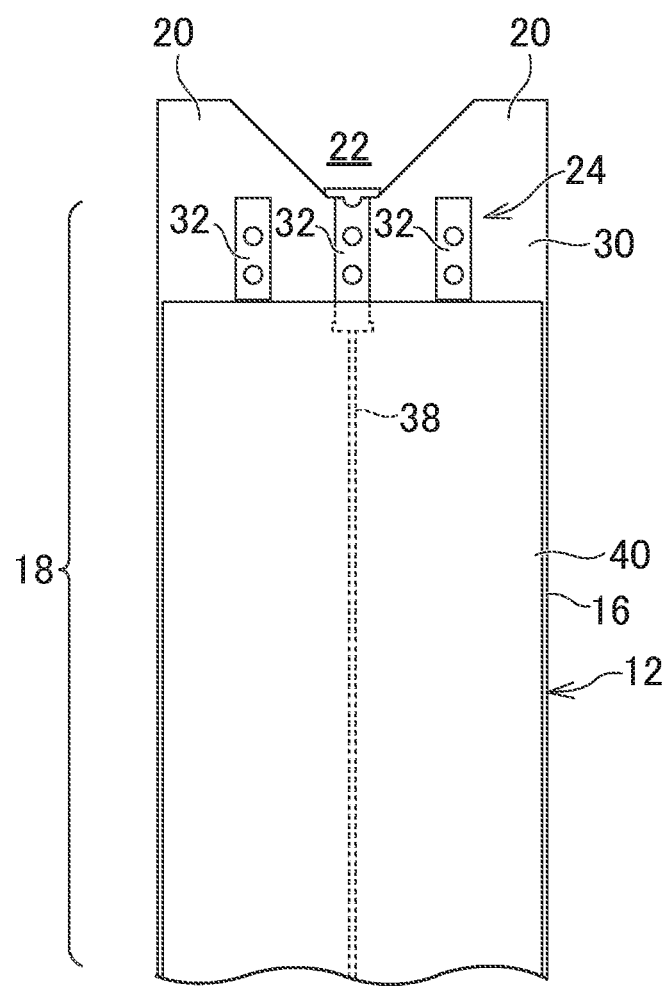
FIG. 3 is a plan view of the flexible substrate.
Figure 4:
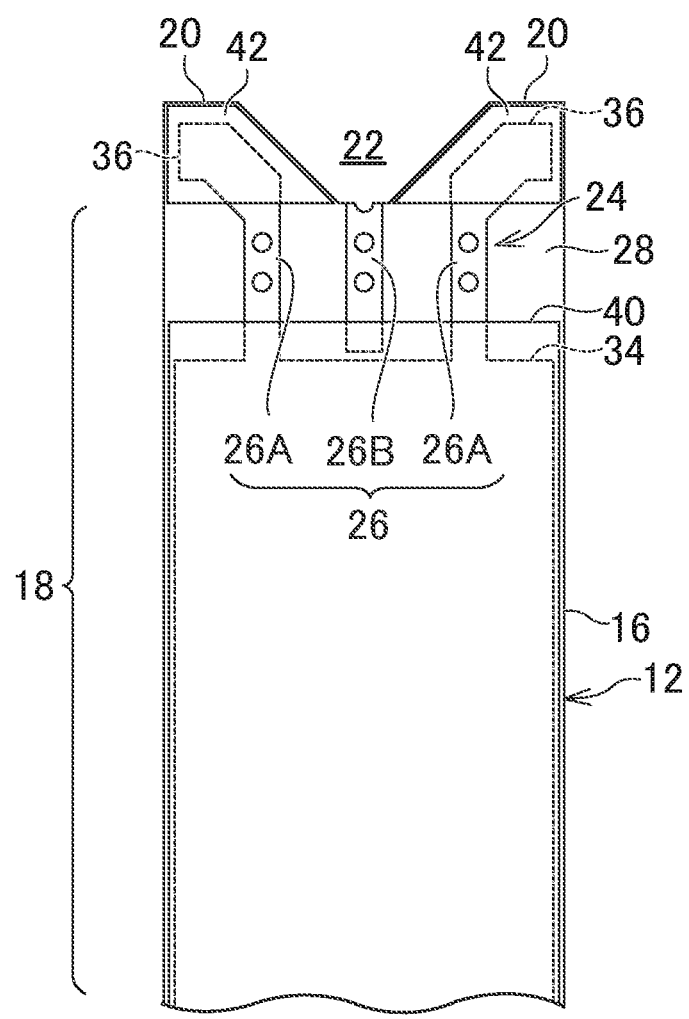
FIG. 4 is a bottom view of the flexible substrate.

FIG. 2 is a plan view of a flexible substrate 12 and a printed circuit board 14, connected. FIG. 3 is a plan view of the flexible substrate 12. FIG. 4 is a bottom view of the flexible substrate 12.

The optical module 100 has a flexible substrate 12. The flexible substrate 12 has an insulating film 16. The insulating film 16, in a planar shape, has some projections 20 protruding from a basic area 18. The basic area 18 may be rectangular. Each projection 20 may have a trapezoidal shape. The respective projections 20 protrude in a first direction D1 from the basic area 18. The projections 20 are arranged in a second direction D2 perpendicular to the first direction D1. An adjacent pair of projections 20 are spaced apart from each other. The insulating film 16, in a planar shape, has a recess 22 between the adjacent pair of projections 20. The recess 22 has a shape with a width (spacing between the adjacent pair of projections 20) that is larger in accordance with a distance from the basic area 18.

The flexible substrate 12 has an interconnection pattern 24. The interconnection pattern 24 includes some pads 26 (FIG. 4). The pads 26 are arranged in the second direction D2 in the basic area 18 on a first surface 28 (surface opposed to the printed circuit board 14) of the insulating film 16. The pads 26 include some first pads 26A adjacent to the respective projections 20. The pads 26 include at least one (e.g., only one) second pad 26B adjacent to the recess 22. The second pad 26B has an edge that is an edge of the recess 22.

There are some auxiliary pads 32 on a second surface 30 opposite to the first surface 28, as shown in FIG. 3. Each auxiliary pad 32 is connected to a corresponding one of the pads through the insulating film 16 (e.g., through a through-hole). Incidentally, as shown in FIG. 1, the optical sub-assembly 10, at a portion other than the pads 26 (portion omitted in FIG. 2), is brazed or soldered to the interconnection pattern 24.

The interconnection pattern 24 includes a ground plane 34 on the first surface 28 (FIG.4). The ground plane 34 is continuous from the first pads 26A. The interconnection pattern 24 includes some dummy terminals 36. The dummy terminals 36 are on the first surface 28, at the respective projections 20, and continuous from the respective first pads 26A.

The interconnection pattern 24, as shown in FIG. 3, includes at least one (one in a single-ended system) signal line 38 on the second surface 30 opposite to the first surface 28. The at least one signal line 38 is electrically connected to the at least one second pad 26B, through the insulating film 16. For example, the signal line 38 is continuous from the auxiliary pad 32 corresponding to the second pad 26B.

The flexible substrate 12 has a cover layer 40. The cover layer 40 is in the basic area 18 on the first surface 28. The cover layer 40 covers the interconnection pattern 24 except for each pad 26. The ground plane 34 is between the insulating film 16 and the cover layer 40. The cover layer 40 covers the signal line 38 on the second surface 30 as well.

The flexible substrate 12 has a spacer layer 42 (FIG. 4). The spacer layer 42 is at each projection 20 on the first surface 28. The spacer layer 42 is equal in material and thickness to the cover layer 40. The spacer layer 42 and the cover layer 40 may be comprised of a coverlay. The dummy terminals 36 are between the insulating film 16 and the spacer layer 42.

Figure 5:
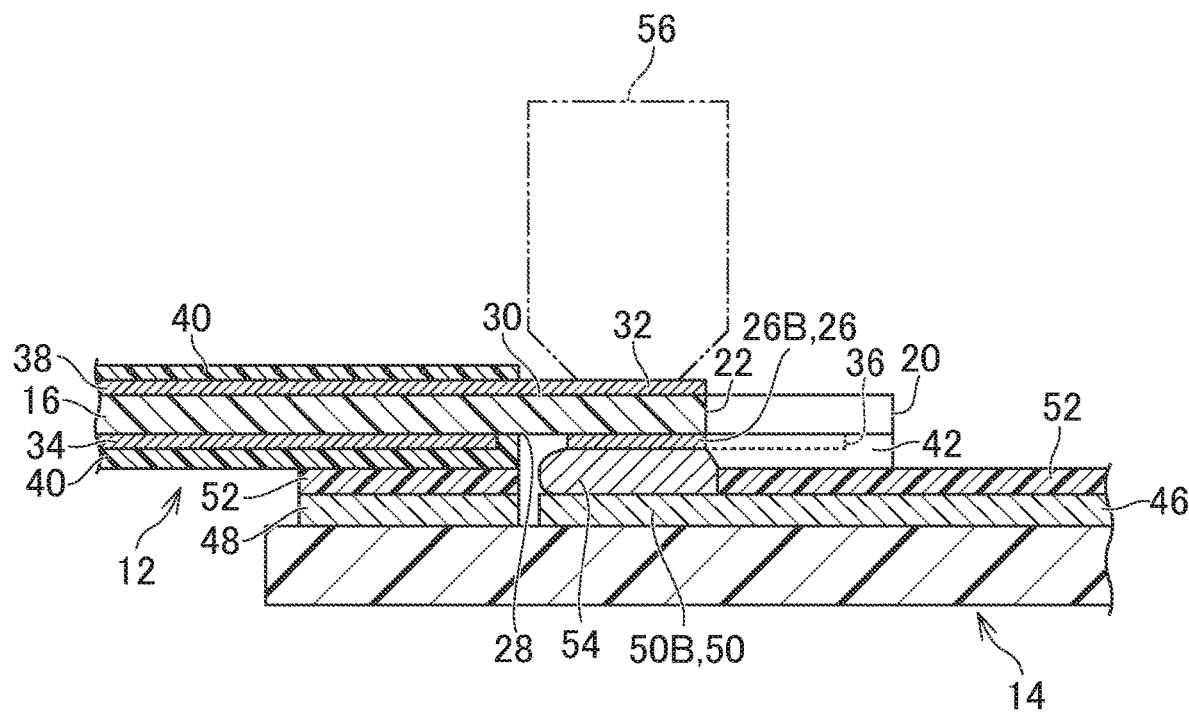
FIG. 5 is a V-V line cross-sectional view of the flexible substrate and the printed circuit board in FIG. 2.
Figure 6:
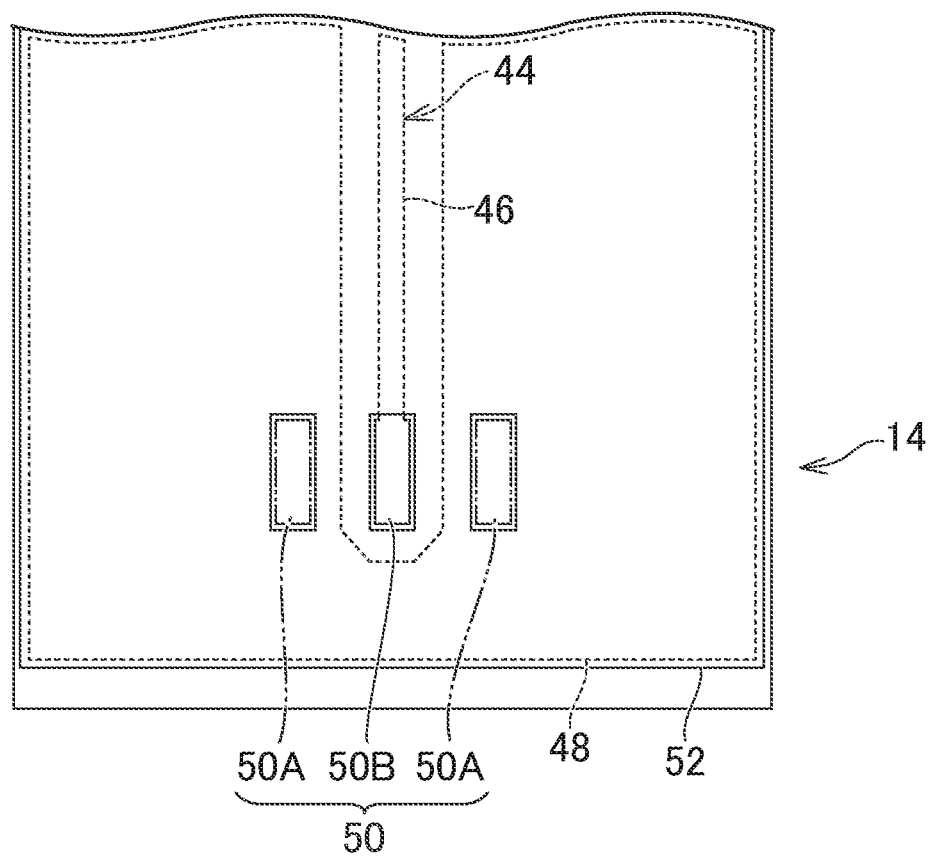
FIG. 6 is a plan view of the printed circuit board.

FIG. 5 is a V-V line cross-sectional view of the flexible substrate 12 and the printed circuit board 14 in FIG. 2. FIG. 6 is a plan view of the printed circuit board 14.

The optical module 100 includes the printed circuit board 14. The printed circuit board 14 has a conductor pattern 44. The conductor pattern 44 includes at least one (one in the single-ended system) transmission line 46. The conductor pattern 44 includes a conductive plane 48. The conductive plane 48 is, as shown in FIG. 6, on both sides of the at least one transmission line 46. Alternatively, part of the conductive plane 48 has a cutout to place the transmission line 46.

The conductor pattern 44 includes some electrodes 50. The conductive plane 48 is continuous from at least one (e.g., two) of the electrodes 50. In FIG. 6, the conductive plane 48 and the electrodes 50 are integral. The at least one transmission line 46 is continuous from another at least one of the electrodes 50.

The electrodes 50 are opposed to the respective pads 26. The electrodes 50 include some first electrodes 50A. The first electrodes 50A are opposed to the respective first pads 26A. The electrodes 50 include at least one (e.g., only one) second electrode 50B. The at least one second electrode 50B is opposed to the at least one second pad 26B.

The printed circuit board 14 has a protective layer 52. The protective layer 52 covers the conductor pattern 44 except for the electrodes 50. The printed circuit board 14 is opposed to the projections 20 and in contact with the spacer layer 42. The spacer layer 42 is in contact with the protective layer 52. With the spacer layer 42, there is a gap between the pad 26 and the electrode 50. In particular, with the dummy terminal 36 under the spacer layer 42, the gap is wider. A filler metal 54 (solder, brazing material) is interposed between the pads 26 and the electrodes 50.

The next explanation is about a connection process of the flexible substrate 12 and the printed circuit board 14. In advance, the filler metal 54 (FIG. 5) is provided on the electrodes 50 of the printed circuit board 14. Then, as shown in FIG.2, positions of the flexible substrate 12 and the printed circuit board 14 are matched. The pads 26 of the flexible substrate 12 cannot be seen because they are on the back (first surface 28). Also, the electrodes 50 of the printed circuit board 14 cannot be seen by being covered with the flexible substrate 12. However, through the recess 22 of the flexible substrate 12 (insulating film 16), it is possible to visually recognize the surface of the printed circuit board 14. Therefore, the second pad 26B, which is adjacent to the recess 22, is placed on the second electrode 50B, thereby performing alignment of the flexible substrate 12 and the printed circuit board 14. Subsequently, as shown in FIG. 5, the filler metal 54 is melted by a hot bar 56 (heater chip). After the filler metal 54 cools down, the pads 26 and the electrodes 50 are bonded to each other. With a space secured between them, a sufficient amount of the filler metal 54 can be secured.

Modification

Figure 7:
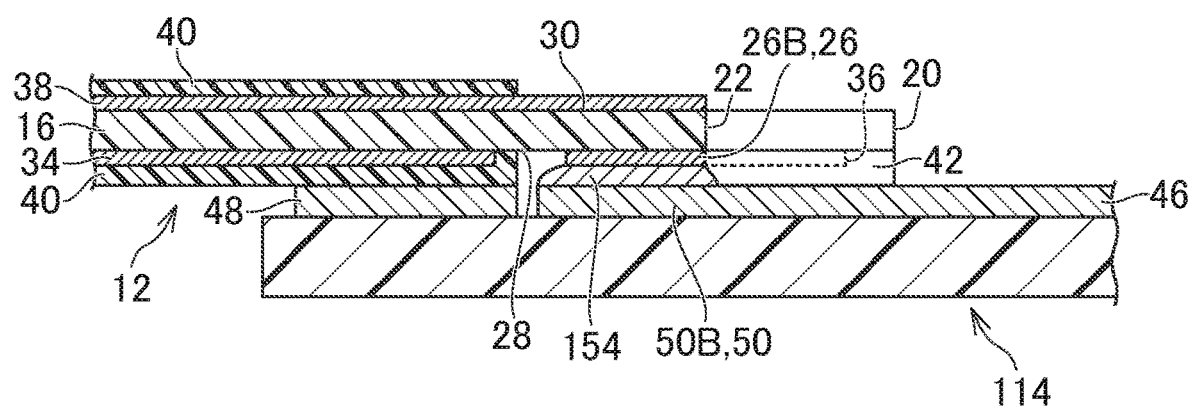
FIG. 7 is a cross-sectional view of part of an optical module in a modification.
Figure 8:
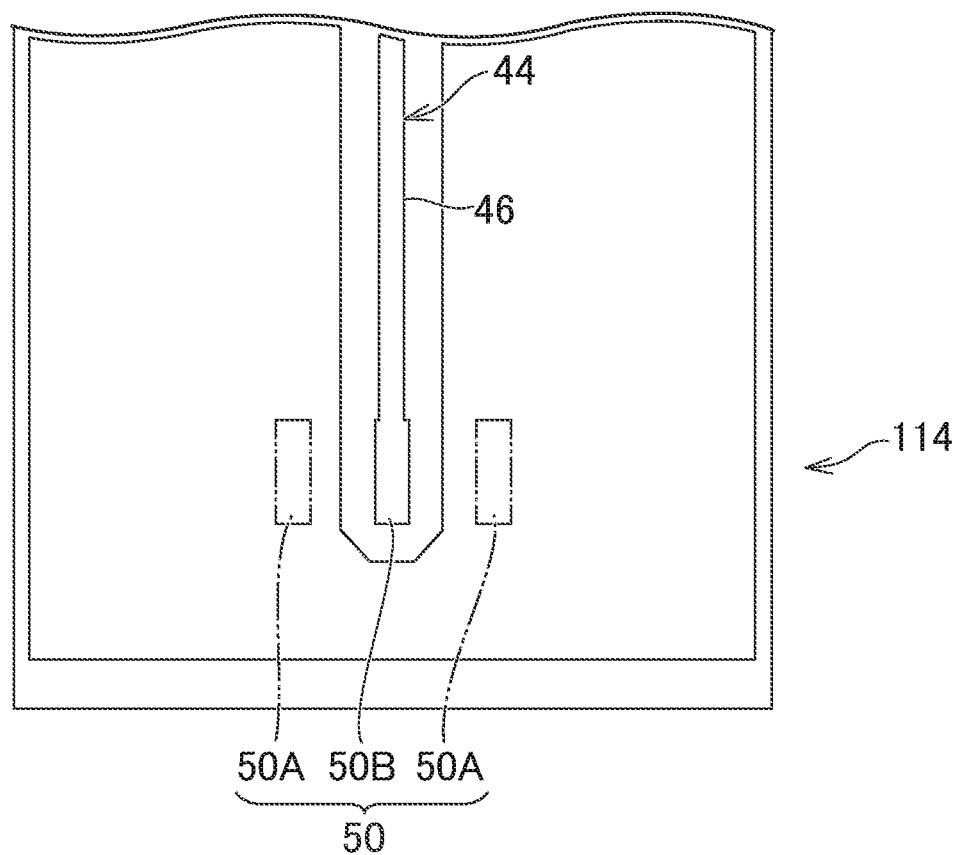
FIG. 8 is a plan view of a printed circuit board in FIG. 7.

FIG. 7 is a cross-sectional view of part of an optical module in a modification. FIG. 8 is a plan view of a printed circuit board in FIG. 7. In the modification, the printed circuit board 114 has no protective layer. Thus, the spacer layer 42 of flexible substrate 12 is in contact with the conductive plane 48. As a result, compared with the first embodiment shown in FIG. 5, the gap between the pads 26 and the electrodes 50 is smaller, but the gap is still ensured by the spacer layer 42, and a sufficient amount of the filler metal 154 can be ensured. With respect to other points, the contents described in the first embodiment are applicable to the modification.

Second Embodiment

Figure 9:
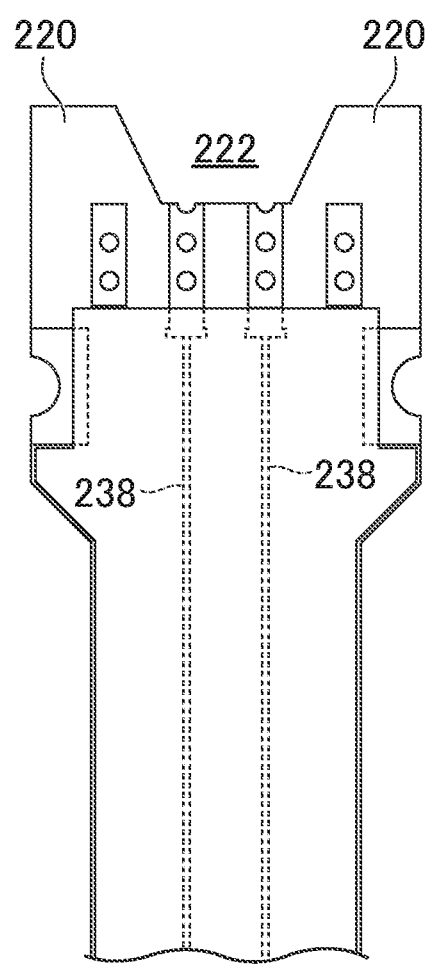
FIG. 9 is a plan view of a flexible substrate included in an optical module in a second embodiment.
Figure 10:
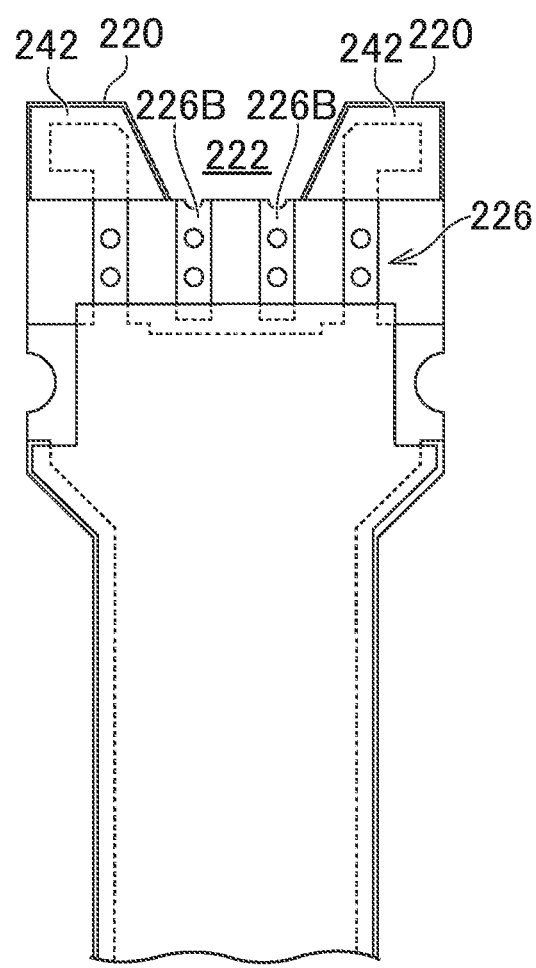
FIG. 10 is a bottom view of the flexible substrate in FIG. 9.

FIG. 9 is a plan view of a flexible substrate included in an optical module in a second embodiment. FIG. 10 is a bottom view of the flexible substrate in FIG. 9. In the second embodiment, the pads 226 include a pair of second pads 226B. Specifically, the pair of second pads 226B, which is adjacent to the recess 222, is electrically connected to the pair of signal lines 238. This structure corresponds to differential signal transmission. In addition, the spacer layer 242 is provided in each projection 220. With respect to other points, the contents described in the first embodiment and the modification are applicable to this embodiment.

Third Embodiment

Figure 11:
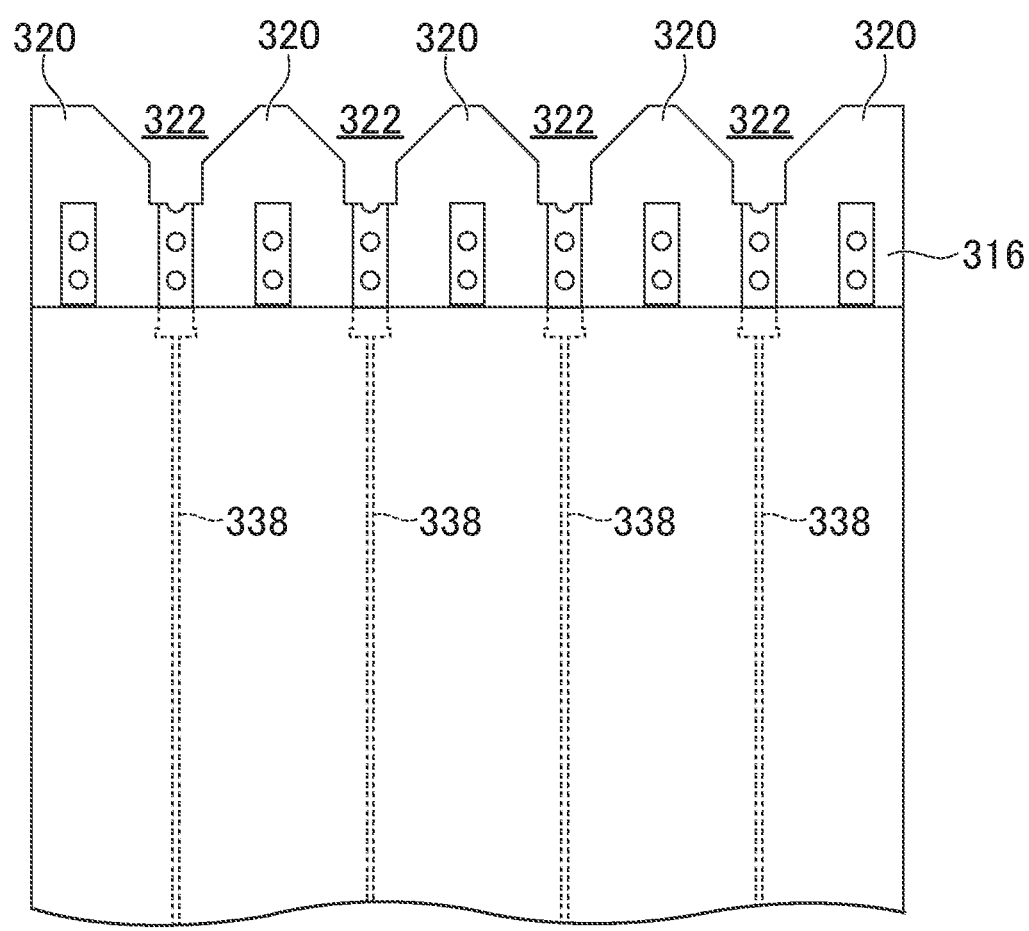
FIG. 11 is a plan view of a flexible substrate included in an optical module in a third embodiment.
Figure 12:
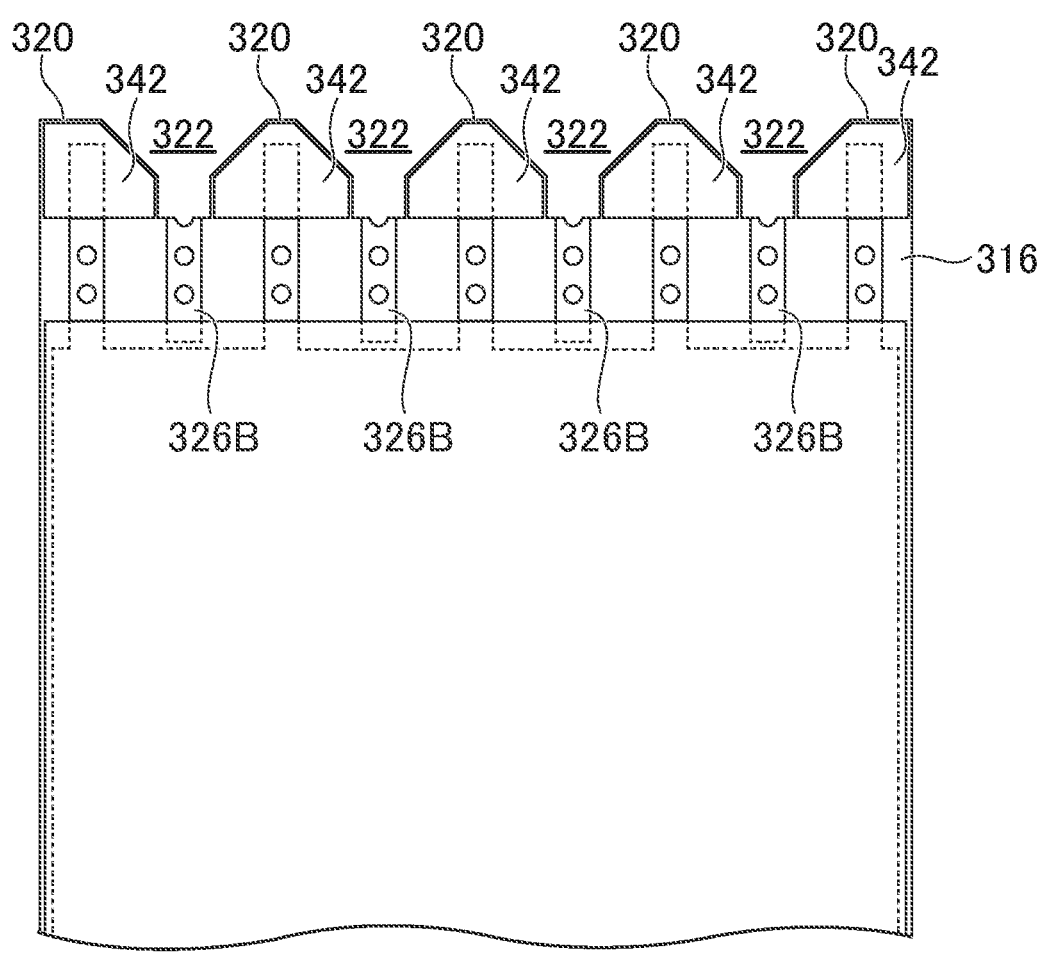
FIG. 12 is a bottom view of the flexible substrate in FIG. 11.

FIG. 11 is a plan view of a flexible substrate included in an optical module in a third embodiment. FIG. 12 is a bottom view of the flexible substrate in FIG. 11. In the third embodiment, the insulating film 316 includes three or more protrusions 320. Therefore, the insulating film 316 includes some recesses 322. There are some second pads 326B adjacent to the recesses 322. The signal lines 338 are continuous from the respective second pads 326B. This structure corresponds to multi-channel signal transmission. In addition, the spacer layer 342 is provided in each projection 320. With respect to other points, the contents described in the first embodiment and the modification are applicable to this embodiment.

The embodiments described above are not limited and different variations are possible. The structures explained in the embodiments may be replaced with substantially the same structures and other structures that can achieve the same effect or the same objective.

What is claimed is:

1. An optical module comprising:
   an optical sub-assembly; and
   a flexible substrate including an insulating film, an interconnection pattern, and a spacer layer, the flexible substrate being connected to the optical sub-assembly,
   the insulating film having some projections, the projections protruding from a basic area in a first direction, the projections being arranged in a second direction perpendicular to the first direction, the insulating film having a flat shape with a recess between an adjacent pair of the projections,
   the interconnection pattern including some pads in the basic area on a first surface of the insulating film, the pads being arranged in the second direction,
   the pads including some first pads adjacent to the respective projections, the pads including at least one second pad adjacent to the recess,
   the spacer layer being on the first surface and at each of the protrusions.

2. The optical module according to claim 1, wherein the at least one second pad is one of the pads.

3. The optical module according to claim 1, wherein the at least one second pad is two of the pads.

4. The optical module according to claim 1, wherein the projections are three or more projections.

5. The optical module according to claim 1, wherein
   the flexible substrate includes a cover layer on the first surface and in the basic area, the cover layer covering the interconnection pattern except for the pads, and
   the spacer layer is equal in material and thickness to the cover layer.

6. The optical module according to claim 5, wherein
   the interconnection pattern includes a ground plane on the first surface, and
   the ground plane is between the insulating film and the cover layer.

7. The optical module according to claim 6, wherein the ground plane is continuous from the first pads.

8. The optical module according to claim 1, wherein the interconnection pattern includes some dummy terminals, the dummy terminals being between the insulating film and the spacer layer, the dummy terminals being at the projections, the dummy terminals being continuous from the first pads.

9. The optical module according to claim 1, wherein
   the interconnection pattern includes at least one signal line on a second surface opposite to the first surface, and
   the at least one signal line penetrates the insulating film and is connected to the at least one second pad.

10. The optical module according to claim 1, further comprising:
    a printed circuit board including a conductor pattern, the conductor pattern including some electrodes opposed to the respective pads, the printed circuit board being opposed to the projections and in contact with the spacer layer; and
    a filler metal between the pads and the electrodes.

11. The optical module according to claim 10, wherein the conductor pattern includes a conductive plane continuous from at least one of the electrodes.

12. The optical module according to claim 11, wherein
    the conductor pattern includes at least one transmission line continuous from another at least one of the electrodes, and
    the conductive plane is on both sides of the at least one transmission line.

13. The optical module according to claim 12, wherein the electrodes include some first electrodes opposed to the respective first pads and at least one second electrode opposed to the at least one second pad.

14. The optical module according to claim 11, wherein the spacer layer is in contact with the conductive plane.

15. The optical module according to claim 10, wherein
    the printed circuit board further includes a protective layer covering the conductor pattern except for the electrodes, and
    the spacer layer is in contact with the protective layer.

16. The optical module according to claim 1, wherein the optical sub-assembly is brazed or soldered to the interconnection pattern except at the pads.

* * * * *